United States Patent [19]
obinata

[11] Patent Number: 5,043,730
[45] Date of Patent: Aug. 27, 1991

[54] DIGITAL-ANALOG CONVERSION CIRCUIT WITH APPLICATION OF VOLTAGE BIASING FOR DISTORTION STABILIZATION

[75] Inventor: Hajime obinata, Kodaira, Japan

[73] Assignee: Nakamichi Corporation, Kodaira, Japan

[21] Appl. No.: 452,219

[22] Filed: Dec. 18, 1989

[30] Foreign Application Priority Data

Dec. 16, 1988 [JP] Japan .................. 63-163328[U]

[51] Int. Cl.⁵ .................................. H03M 1/80
[52] U.S. Cl. ........................ 341/153; 341/140; 341/144; 341/133; 323/280
[58] Field of Search .......... 341/153, 140, 144, 267, 341/133; 323/280

[56] References Cited

U.S. PATENT DOCUMENTS

| | | | |
|---|---|---|---|
| 3,781,642 | 12/1973 | Dutton | 323/280 |
| 3,805,145 | 4/1974 | Gordon | 323/280 |
| 4,888,589 | 12/1989 | Bowers | 341/153 |

*Primary Examiner*—Benjamin R. Fuller
*Assistant Examiner*—Nancy Le
*Attorney, Agent, or Firm*—Pearne, Gordon, McCoy & Granger

[57] ABSTRACT

A digital-analog converter circuit comprising a current output type digital-analog converter and a current-/voltage converter connected to an output terminal of the current output type digital/analog converter, the current/voltage converter including bias application means to always apply a bias voltage having a predetermined set value to the output terminal of the digital-/analog converter.

4 Claims, 4 Drawing Sheets

DIGITAL-ANALOG CONVERSION CIRCUIT WITH APPLICATION OF VOLTAGE BIASING FOR DISTORTION STABILIZATION

BACKGROUND OF THE INVENTION

In general, a digital/analog converter circuit comprises a current output type digital/analog converter and a current/voltage converter. FIG. 2A shows a prior art general relation of connection of a digital-/analog converter circuit comprising a current output type digital/analog converter 2 and a current/voltage converter 21 connected to a next stage of the digital-/analog converter 2. The digital/analog converter 2 receives a 16 bit serial digital signal $S_1$, converts the digital signal $S_1$ into a parallel signal by a signal processing portion 19 involved therein and supplies in parallel with a predetermined period T to bit current output portions 3 through 18, bit signals $\overline{S}_2$ to $\overline{S}_{17}$ corresponding to respective values between MSB (Most Significant Bit) and LSB (Least Significant Bit) and inversion bit signals $S_2$ to $S_{17}$ which are inversions of the bit signals $S_2$ to $S_{17}$, respectively.

As noted from FIG. 2B, the bit current output portion 3 comprises a circuit which includes a transistor Q1 having a base connected to an input terminal $3_1$ and a collector connected to a base of a transistor Q3 and also connected through a resistor R4 to a positive electric source Vc and a transistor Q2 having a base connected to an input terminal $3_2$ and a collector connected to the positive electric source Vc while emitters of the transistors Q1 and Q2 are connected commonly to a constant current source 20.

The transistor Q3 has a collector connected to the positive electric source Vc while a transistor Q4 has a collector and a base connected commonly to an output terminal $3_3$. The emitters of the transistors Q3 and Q4 are connected commonly to collectors of transistors Q5 and Q6. A reference voltage Vr is applied to a base of the transistor Q5, a base of the transistor Q6 is connected to an emitter of the transistor Q5 while an emitter of the transistor Q6 is connected to a bit current source $3_4$.

Although the other bit current output portions 4 through 18 may be constructed in the same manner as the bit current output portion 3, the respective constant current values of bit current sources $3_4$ through $18_4$ (not shown) of the bit current output portions 4 through 18 are set at two times the constant current value of the immediately lower bit current source. More particularly, a relation of the value of the constant current $I_1$ of the bit current source $3_4$ of the MSB and the value of the constant current $I_{16}$ of the bit current source $18_4$ of the LSB is expressed by:

$$I_{16} = I_1 / 2^{16}$$

An operation of the digital/analog converter 2 will be described with reference to FIG. 3.

The bit signal $S_2$ and the inversion bit signal $\overline{S}_2$ of the MSB supplied to the input terminals $3_1$ and $3_2$ are so set as to be at the states of "H" and "L", respectively when the value of the MSB is 1. Thus, as shown in FIG. 3(a), as the states of the bit signal $S_2$ and the inversion bit signal $\overline{S}_2$ vary in accordance with the values of the MSB, the transistors Q1 and Q2 are alternately turned on and off and a base voltage $V_1$ of the transistor Q3 varies between the values Vh and Vl in accordance with the alternate conduction of the transistors Q1 and Q2. The values Vh and Vl of the base voltage are determined by the value of current If, the set value of the resistor R4 and the set switching areas of the transistors Q1 and Q2. For example, it is supposed that the absolute values of Vh and Vl are set to be equal to each other so that the medium level between them becomes 0V.

It is further supposed that the base voltage $V_1$ of the transistor Q3 has a wave varying as shown in FIG. 3(a) so that a velocity of variation in level is damped by the function of the capacity components of the transistors Q1 and Q2 and the resistor R4.

The base voltage Vm of the transistor Q4 which is the voltage at the output terminal $3_3$ of the bit current output portion 3 is set by the current/voltage converter 21 connected to the next stage thereof and in this case, it is 0V because 0V is applied to a non-inversion terminal of an operational amplifier $21_1$ as shown in FIG. 2A.

Thus, in case that the base voltage $V_1$ of the transistor Q3 is more than the base voltage Vm of the transistor Q4, then the constant current $I_1$ through the bit current source $3_4$ flows through the emitter of the transistor Q3. In case that the base voltage $V_1$ of the transistor Q3 is less than the base voltage Vm of the transistor Q4, then it flows through the emitter of the transistor Q4. The bit current $Ib_1$ of the MSB flowing through the output terminal $3_3$ is shown in FIG. 3(a). Since a variation in the state of the bit current $Ib_1$ is always delayed by a constant delay time t relative to a variation in the bit signal $S_2$, there occurs no inconvenience due to its delay time t.

Although only the bit current $Ib_1$ through the bit current output portion 3 varying in accordance with the values of the MSB is described, the bit currents $Ib_2$ through $Ib_{16}$ of the 2SB through the LSB flow through the corresponding bit current output portions with a predetermined relation of current varying in accordance with the values of the respective bits in the same manner as the bit current $Ib_1$.

The current/voltage converter 21 supplies an output voltage signal Vo having a voltage value varying in proportion to a value of an addition current Io of the respective bit currents $Ib_1$ through $Ib_{16}$ through a low-pass filter 22 and a coupling capacitor C1 to an output portion 23.

The low-pass filter 22 serves to cut the frequency component of period less than a half of the aforementioned period T in an acute attenuation characteristic while the coupling capacitor C1 serves to cut a direct voltage component.

The transistors Q5 and Q6 darlington-connected to each other serve to make constant the voltage applied to the bit current source $3_4$.

As noted from the foregoing, the analog voltage signal corresponding to the input 16 bit serial digital signal $S_1$ is output from the output portion 23 by the digital/analog converter 2, the current/voltage converter 21, the low-pass filter 22 and the coupling capacitor C1.

As shown in FIG. 3(a), the base voltage $V_1$ of the transistor Q3 responds in a damped manner to level variation by the function of the capacitance component of the transistor Q1 and the resistor R4 connected to the collector thereof. The respective bit currents Ib rapidly vary in their state because of rapid switching operation of a current flowing path by the transistors Q3 and Q4 which constitute a sort of diode switch.

In case that the set voltages Vh and Vl are constantly offset in a positive or plus direction by various conditions such as manufacturing errors so that they become $Vh_1$ and $Vl_1$, respectively as shown in FIG. 3(b), the base voltage Vm of the transistor Q4 is so set to be 0V and as a result, the delay rise time $t_1$ of the bit current $Ib_1$ is different from the delay fall time $t_2$ of the bit current $Ib_1$. Thus, the following relation of the delay times $t_1$, $t_2$ and t will be established;

$$t_1 > t > t_2$$

On the other hand, in case that the set voltages Vh and Vl are offset in a negative or minus direction, the following relation of the delay times $t_1$, $t_2$ and t will be established;

$$t_1 < t < t_2$$

Since a variation in the delay times $t_1$ and $t_2$ is generated not only for the bit current $Ib_1$, but also for the bit currents $Ib_2$ through $Ib_{16}$ of the 2SB through the LSB, so that timing of turning on and off the diode switch is different from each other. Therefore, there occurs a glitch, which causes the converted analog signal to have harmonic distortion.

SUMMARY OF THE INVENTION

Accordingly, it is a principal object of the invention to provide a digital/analog converter circuit adapted to always operate a conventional digital/analog converter in a best condition so that there occurs no glitch.

In accordance with one aspect of the present invention, there is provided a digital/analog converter circuit comprising a current output type digital/analog converter formed by a diode switch to switch respective bit output current through an output terminal based on a comparison of a bias voltage applied to said output terminal and a formation voltage signal formed inside so as to vary between two values in accordance with corresponding bit values of a digital signal and a current-/voltage converter to convert a current flowing through said output terminal of said digital/analog converter into a voltage as an analog signal;

said current/voltage converter characterized by including bias application means to always apply said bias voltage having a predetermined value to said output terminal of said digital/analog converter.

BRIEF DESCRIPTION OF THE DRAWINGS

The above and other objects and features of the invention will be apparent from the description of the embodiment of the invention with reference to the accompanying drawings in which.

DESCRIPTION OF THE PREFERRED EMBODIMENT

Figure 1:
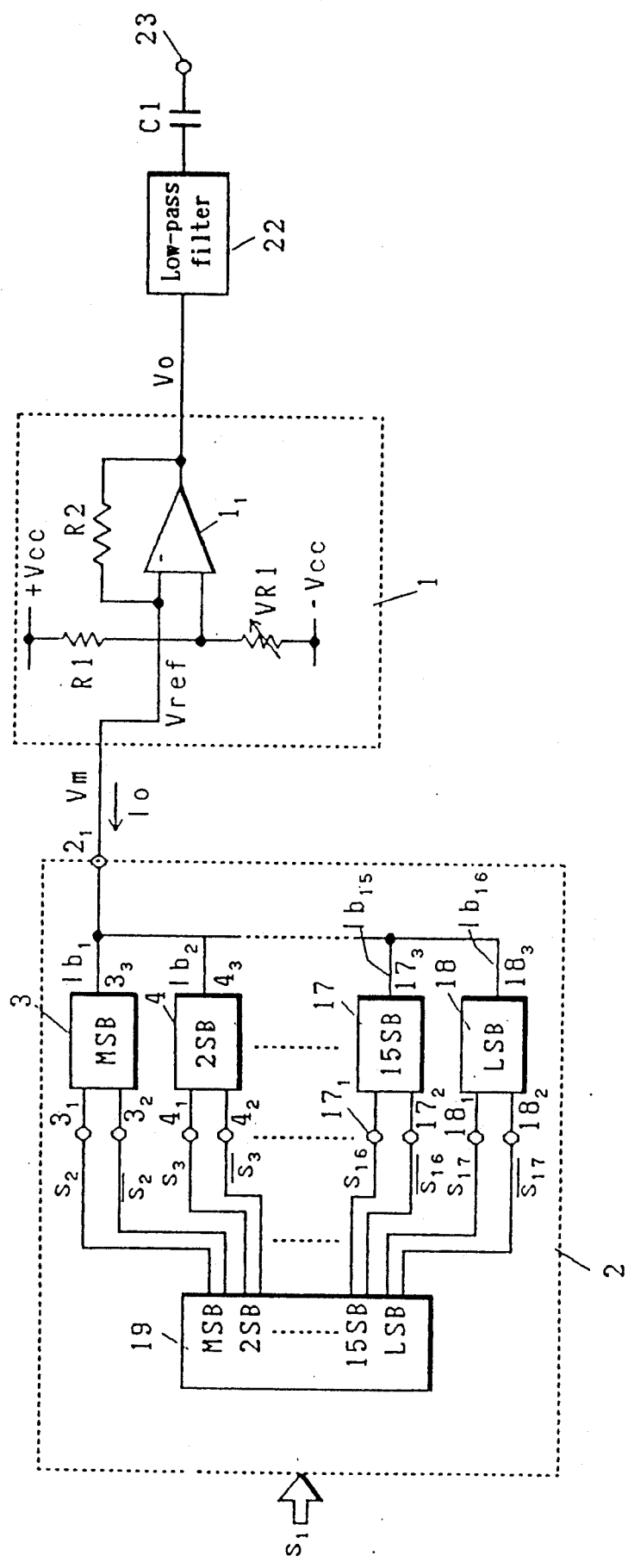
FIG. 1 is a schematic diagram of connection of a current output type digital/analog converter and a current/voltage converter constructed in accordance with one embodiment of the invention.

Referring now to FIG. 1, there is shown a digital-/analog converter circuit constructed in accordance with one embodiment of the invention. The same reference numerals designate the same components.

The digital/analog converter circuit of the invention comprises a current/voltage converter 1 which includes an operational amplifier $1_1$ having an inversion input terminal connected to the output terminal $2_1$ of the current output type digital/analog converter 2. The output terminal $2_1$ of the digital/analog converter 2 is connected also through a resistor R2 to an output terminal of the operational amplifier $1_1$. A non-inversion input terminal of the operational amplifier $1_1$ is connected through a resistor R1 to a positive or plus electric source +Vcc and also through a variable resistor VR1 to a negative or minus electric source −Vcc. The output terminal of the operational amplifier $1_1$ is connected through the low-pass filter 22 and the coupling capacitor C1 to the output portion 23.

An operation of the digital/analog converter circuit of the invention will be described hereinbelow.

The variable resistor VR1 serves to adjust a bias voltage Vref applied to the output terminal $2_1$ of the digital/analog converter 2, which is made by adjusting an applied voltage of the non-inversion input terminal of the operational amplifier $1_1$.

Figure 2B:
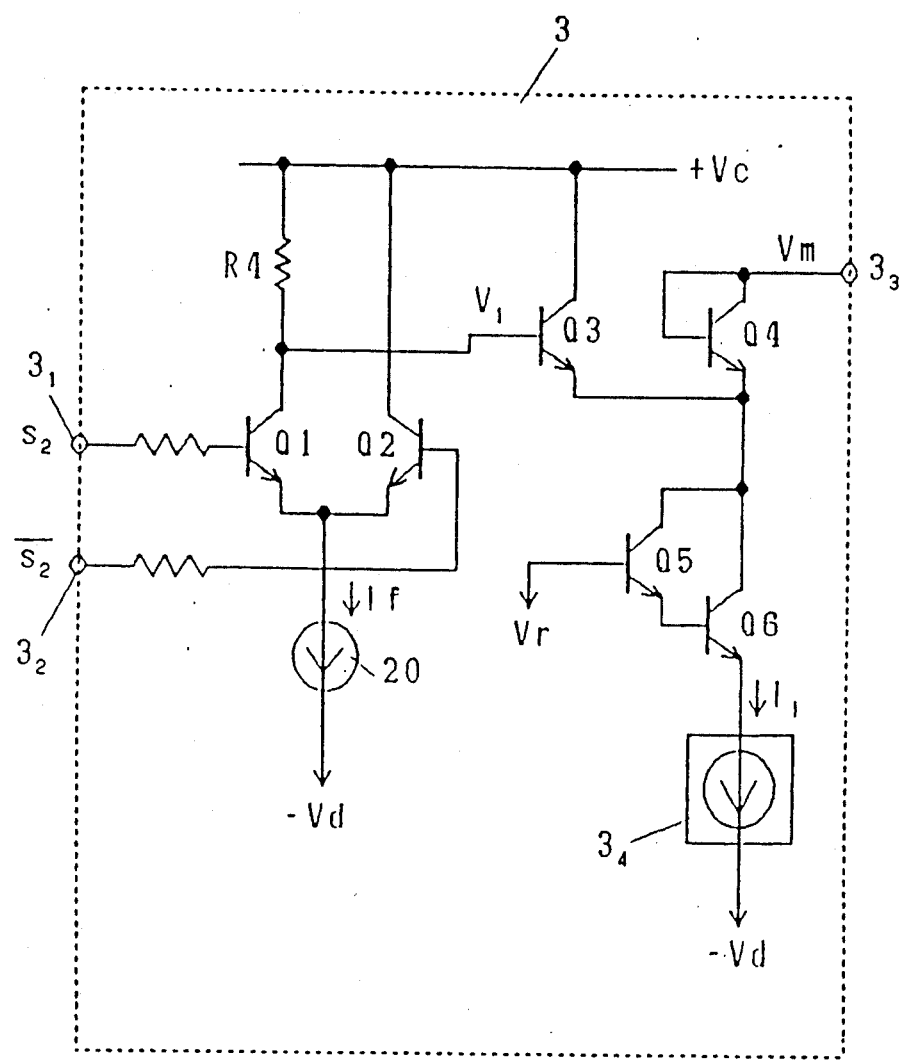
FIG. 2B is a schematic diagram of one bit current output portion.
Figure 2A:
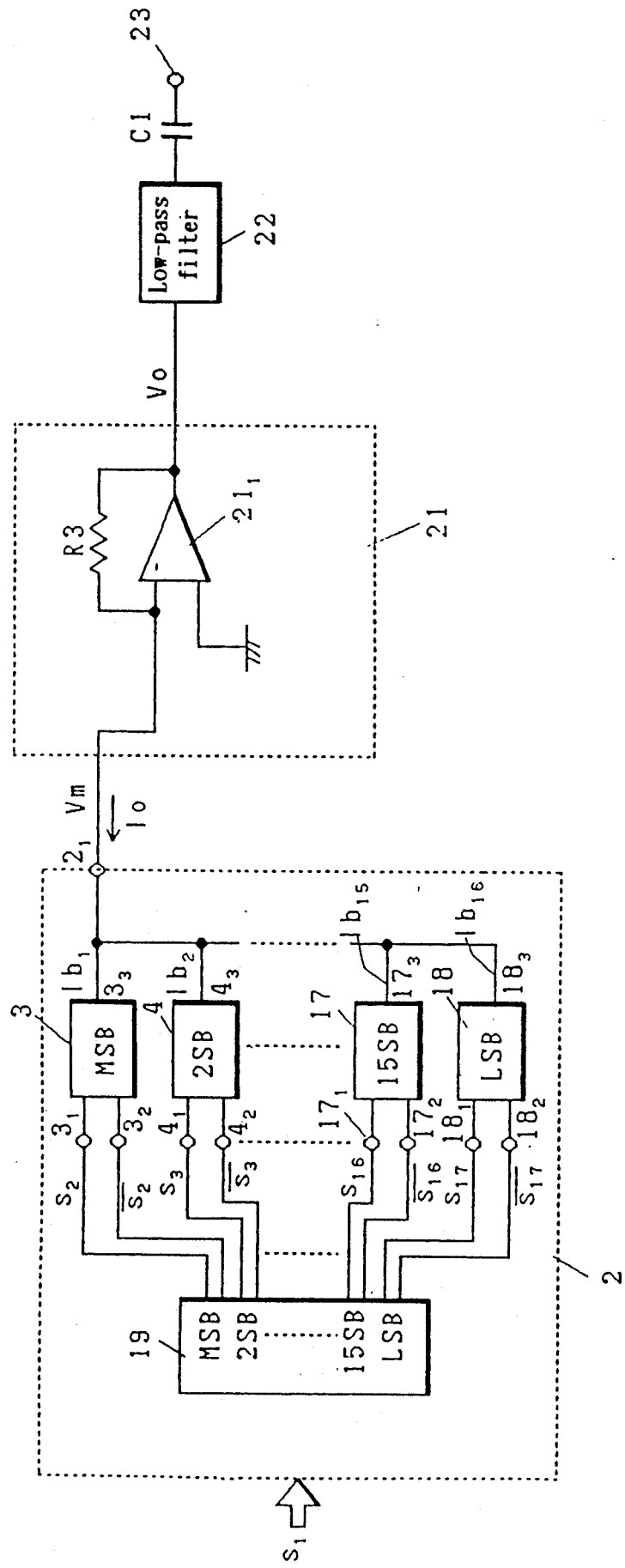
FIG. 2A is a schematic diagram of a prior art connection of a current output type converter and a current-/voltage converter.
Figure 3:
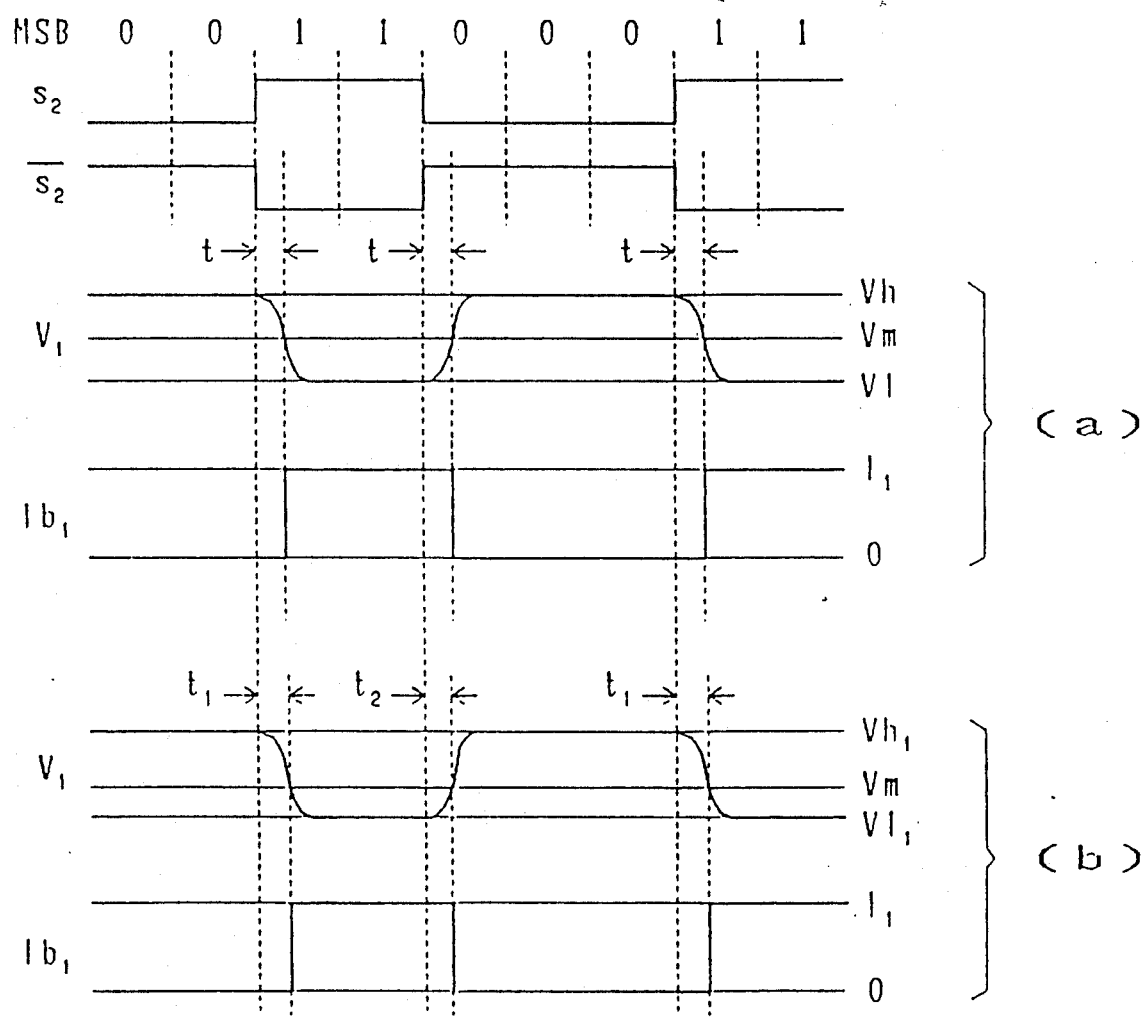
FIG. 3 shows wave forms for illustration of the invention.

The bias voltage Vref corresponds to the base voltage Vm of the transistor Q4 shown in FIG. 2B and as a result, the bias voltage Vref is equal to the base voltage Vm.

The output voltage signal Vo is expressed as follows;

$$Vo = Io \cdot R2 + Vref$$

It should be noted that the bias voltage Vref is cut by the coupling capacitor C1 with the result that it never appears at the output portion 23. It will be understood that the coupling capacitor C1 may be replaced by a DC servo circuit.

Although the bias voltage Vref should be adjusted to a medium level between the voltages Vh and Vl between which the base voltage $V_1$ of the transistor Q3 varies so that the delay times $t_1$ and $t_2$ are equal to each other, other methods may be employed because the voltages Vh and Vl cannot be acknowledged due to one chip IC by which the digital/analog converter 2 is normally formed.

As aforementiond, variation in the delay times $t_1$ and $t_2$ causes a glitch and harmonic distortion of the analog signal to occur. In order to avoid it, the variable resistor VR1 is adjusted so that the harmonic distortion of the analog signal from the output portion 23 is minimized although the 16 bit serial digital signal $s_1$ having a sine wave of predetermined frequency is input to the input terminal of the digital/analog converter 2.

Although one embodiment of the invention has been illustrated and described with reference to the accompanying drawings, it will be understood by those skilled in the art that it is by way of example, and that various changes and modifications may be made without departing from the spirit and scope of the invention. For example, although, in the illustrated embodiment, the bias voltage is adjusted by the variable resistor, a stationary value of bias voltage so set as to minimize the harmonic distortion of the analog signal may be applied to the operational amplifier in case that the digital-/analog converter circuits are mass-produced using digital/analog converters having the variation of the same tendency. It should be understood that the invention is intended to be defined only by the appended claims.

What is claimed is:

1. A digital/analog converter circuit comprising a current output digital/analog converter including a plurality of bit current output portions having a diode switch, respectively, to switch respective bit output current through an output terminal based on a comparison of a bias voltage applied to said output terminal and a formation voltage signal formed inside so as to vary between two values in accordance with corresponding bit values of a digital signal and a current/voltage converter to convert a current flowing through said output terminal of said digital/analog converter into a voltage as an analog signal, said current/voltage converter characterized by including bias application means for always applying said bias voltage having a predetermined value to said output terminal of said digital/analog converter so that timing of turning on and off said diode switch is substantially consistent with each other.

2. A digital/analog converter circuit as set forth in claim 1, wherein said current/voltage converter comprises an operational amplifier having an inversion input terminal to which said current output signal from said digital/analog converter is applied and a non-inversion input terminal and wherein said bias application means includes a voltage source, a voltage divider including a variable resistor for dividing a voltage to be applied to said non-inversion input terminal.

3. A digital/analog converter circuit as set forth in claim 1, wherein said current/voltage converter comprises an operational amplifier having an inversion input terminal to which said current output signal from said digital/analog converter is applied, a resistor connected between said inversion input terminal of said operational amplifier and an output terminal of said operational amplifier and voltage application means for applying a voltage of medium value between said two values to an non-inversion input terminal of said operational amplifier.

4. A digital/analog converter circuit comprising a current output digital/analog converter including a plurality of bit current output portions having a diode switch, respectively, to switch respective bit output current through an output terminal based on a comparison of a bias voltage applied to said output terminal and a formation voltage signal formed inside so as to vary between two values in accordance with corresponding bit values of a digital signal and a current/voltage converter to convert a current flowing through said output terminal of said digital/analog converter into a voltage as an analog signal, said current/voltage converter including bias application means for always applying said bias voltage having a predetermined value to said output terminal of said digital/analog converter signal so that a harmonic distortion of said analog signal from said output terminal is minimized.

* * * * *